Nov. 17, 1964 3,157,796
...IT WITH
...HASE
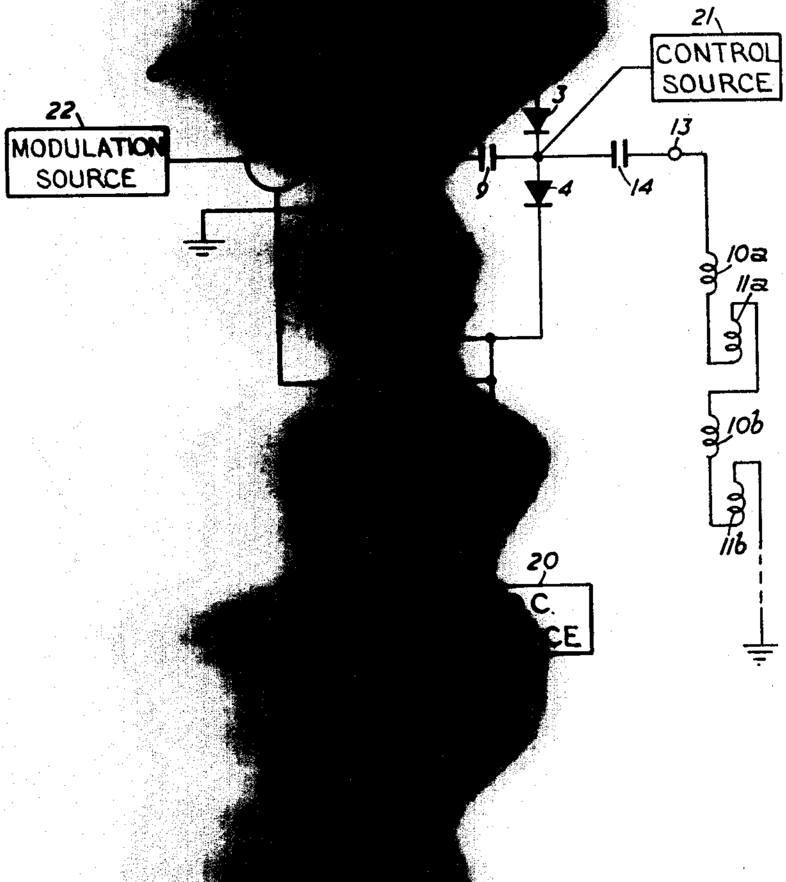
INVENTOR
HAROLD NOEL COATES
BY Hane and Nydick
ATTORNEYS United S 3,157,796

Patented Nov. 17, 1964

TUNNEL DIODE S
MEANS CON
Harold Noel Coates,
International Comp
Filed Feb. 28, 1962,
Claims priority, application Gre
9,463/61
5 Claims. (Cl. 307

This invention relates
forming logical operati

Many pulse opera
forming logical operations,
tions. Such circuits may
dynamic storage devices for use
and the like. It is difficult
operation at frequencies
when number of these pu
connected to form large
electronic computer.

The difficulties associated
largely eliminated in logic
rons. A variety of logic ci
are described in an article
Digital Computing Elem
Oscillation" by E. Goto
August 1959, pages 13
consists of a tuned circuit
element, and which has
with a frequency approxi
quency of the tuned circu
a variation of the non-li
produces an oscillatory
the second sub-harmo
sub-harmonic voltage
are relatively displaced
condition of the circuit at th
harmonic oscillation starts.

Provision must be made for switchi
condition to the other if the devi
element. Substantial energy is
and this makes it impracticabl
one phase condition to the other.
come by periodically quenching the
wave modulation of the exciting v
a small control voltage to determine
oscillation each time that it re-starts.

Although the parametron is basically
wave device, the necessity for
troduces the difficulty of obtaini
associated with pulse operat
monic oscillation takes an appre
and decay, since the circuit consists en
elements. For example, twenty cycles
voltage may be required for the oscil
build up to a uniform amplitude
the voltage to decay. A time
number of cycles at uniform
quired to provide an indication
cuit. Thus, the maximum switchi
to be only a sixtieth, or less, of
Furthermore, all the output p
the exciting source, since the circ

2 nce, a substantial amount of power
equency is required to operate a logical
nsisting of interconnected parametrons.
t of the invention to provide an improved
employing active elements, which operates
onic of a driving frequency.
to the invention an electrical logic circuit
es pair of active circuit elements adapted
operating region of negative resistance, a
actance elements of one sign connected
e series pair of active elements, a
ent of opposite sign connected to
r of active elements and to the
reactance elements, the three re-
rming an effective tuned circuit,
g to the tuned circuit a sinusoidal
ving a frequency substantially twice
uency of said tuned circuit, means for
voltage across the pair of active ele-
for deriving from said tuned circuit an
hich is at said resonant frequency and
either one of two phases relatively dis-
nd means for applying an input signal
the active elements to determine the
signal.
will now be described, by way of
ference to the accompanying drawing
it diagram of a logic circuit employing cy source 1 applies a sinusoidal driv-
a resistor 2 to a pair of tunnel diodes
pair of inductors 5 and 6 and a
re connected in parallel with the
The capacitor 7 has a negligible
cy of the driving voltage so that
is substantially at zero R.F. po-
D.C. voltage from a source 20 is
point between a supply terminal 8 and
D.C. voltage is effectively applied across
pair of tunnel diodes via the inductors 5
capacitor 7 preventing the short circuiting
supply.
tor 9 is connected between the junction of the
rs 5 and 6 and the junction of the two tunnel
d 4. The tunnel diodes are biased in the for-
ion by the D.C. voltage applied to the ter-
therefore have a relatively low resistance,
of 50 ohms, for example. The tunnel diodes
substantial shunt capacity of, for example,
e R.F. source 1 may typically operate at a
of 250 mc./s. At this frequency, the reactance
unt capacity of the tunnel diode is approximately
ms. Since the reactances of the shunt capacities
of the capacitor 7 are relatively small, an approxi-
te R.F. equivalent circuit is that of the two inductors
nd 6 connected in parallel across the capacitor 9.
wo inductors 5 and 6 and the capacitor 9 therefore
n effective tuned circuit with a resonant frequency
ined by the value of the capacitor 9 and the re-
inductance of the two inductors in parallel. The
the capacitor 9 and the inductors 5 and 6 are
that the resonant frequency is substantially
lf the frequency of the driving voltage.

The voltage/current characteristic of a tunnel diode is essentially N-shaped. At low voltages the diode behaves as a positive resistance of the order of 50 ohms, the current increasing fairly linearly to a peak of 5 milliamperes at 0.1 volt. As the voltage is further increased, the diode enters a negative resistance region until the current has fallen to a minimum of about .75 milliampere at 0.45 volt. A second positive resistance region follows, so that a voltage of 0.6 volt again produces a current of 5 milliamperes.

It will be appreciated that these numerical values relate to a particular type of tunnel diode and that other type of tunnel diode will have different relative values of current and voltage, but that the general form of their voltage/current characteristic is the same.

It is a feature of devices possessing this N-shaped characteristic that they may be switched very rapidly from a point in the first positive resistance region to a corresponding point of equal current in the second positive resistance region, and vice versa. The R.F. driving voltage controls this switching in the present circuit. As the voltage across the pair of tunnel diodes increases from the start of the first positive half-cycle of the driving voltage, it reaches a value sufficient to maintain one diode in the second positive resistance region and the other in the first positive resistance region. Assume that the diode 3 switches to the second region, then both diodes may be passing approximately 5 milliamperes, but the voltage across the diode 3 will be 0.6 volt and that across the diode 4 will be 0.1 volt. Prior to this, the voltage was divided equally between the two diodes, if they have similar characteristics. The driving voltage will reach a maximum and will then fall towards zero. As the drive voltage decreases, it will fall below the value necessary to maintain the diode 3 in the second region. Thus, the positive half cycle of the driving voltage will produce a positive going voltage pulse across the diode 3 and a negative going voltage pulse across the diode 4. These voltage pulses shock excite the effective tuned circuit, formed by the inductors 5 and 6 and the capacitor 9, at its natural resonant frequency. The negative half cycle of the driving voltage opposes the D.C. voltage applied to the diodes from terminal 8, so that the diodes are not switched. During the next positive half cycle, the driving voltage will again be sufficient to cause switching of the diodes. However, the tuned circuit was shock excited during the previous positive half cycle, so that current is still flowing in the tuned circuit. The current flows in opposite directions in the two inductors and the directions are such that a larger net positive voltage appears across the diode 4 than across the diode 3. Consequently, the diode 4 switches to the second region when the driving voltage increases to a sufficient value. The current in the tuned circuit will have reversed when the next positive half cycle of the driving voltage occurs so that the diode 3 will switch. The diodes will continue to switch alternately on the positive half cycles of the driving voltage as long as the driving voltage is maintained, and the tuned circuit will be driven at the sub-harmonic frequency.

A balanced coupling to the tuned circuit is provided by coils 10 and 11 which are coupled to the inductors 5 and 6, respectively. The coils 10 and 11 are connected so that the induced voltages are additive and a sub-harmonic output voltage will be available at terminal 12 as long as the tuned circuit is driven. The phase of this output will be determined by which of the two positive resistance regions each of the diodes 3 and 4 adapts during the first positive cycle of the driving voltage, i.e., the output voltage will be either in one phase, or in an opposite phase, and once a particular mode is established it is self-sustaining. The phase of the output may therefore be determined by applying a small control voltage to the junction of the two tunnel diodes, to unbalance the voltages across them, during the initial application of the driving voltage. The control voltage may be a sub-harmonic output derived from another similar logic circuit which is applied to an input terminal 13, and is fed to the junction by a coupling capacitor 14. The output coils, such as the coils 10*a*, 11*a*, and 10*b*, 11*b*, of other logic circuits may be connected in series and to the terminal 13. The majority of signals which have a common phase will then cause the circuit to lock to that phase. A D.C. signal from a control source 21, which may be the output from a resistor majority logic circuit, may be applied directly to the junction of the diodes as a control signal, the polarity of the signal determining which diode is switched first.

The driving frequency source 1 may be modulated by a square wave from a modulation source 22 to allow the control signals to be effective, in a similar manner to a parametron. A chain of the tunnel diode logic circuits may be operated by using two or three driving sources with different phases for the modulation frequency, successive circuits being driven from different phases.

The control voltages may also be made effective by sine wave modulation of the driving source 1. This is possible because of a hysteresis effect in the switching characteristic. In order to switch the circuit from a quiescent state to a locked phase state, the voltage across one of the tunnel diodes consisting of the sum of the D.C. voltage across that diode, due to the source 20, the voltage from the driving source 1 and any applied control voltage, must exceed the switching voltage of that diode. However, once the circuit is in the locked phase state, the sub-harmonic voltage is also present and it is always adding to the other voltages across that diode which is switched. Consequently, once the circuit is operating in the locked phase state, the amplitude of driving voltage necessary to keep it operating is smaller than is the amplitude needed to switch it. The operating conditions may be selected so that the mean operating point of the diodes lies between the switching and maintaining voltages, then less than 100 percent sine wave modulation of the driving voltage provides sufficient voltage variation to switch the circuit alternately between the quiescent and locked phase states.

It will be apparent that the R.F. driving source 1 acts primarily as a switching voltage source which controls the relative distribution of the applied D.C. voltage between the two tunnel diodes. Consequently, a substantial part of the output power, which is available at terminal 12, is drawn from the D.C. source. This greatly reduces the power required from the R.F. source to provide a given output power. This is a major advantage, since the generation of power at frequencies of the order of 250 mc./s., and upward is at a low efficiency. The design requirements of the driving source are also less stringent if sine wave modulation rather than square wave modulation is used.

However, the main advantage obtained by the inclusion of active circuit elements, in the form of tunnel diodes, is the great increase in switching speed as compared with the conventional parametric circuit. The voltage appearing across the diodes when they are switched is determined by the diode characteristics. Consequently, the rise time is set simply by the time required for the amplitude of the sub-harmonic oscillation in the tuned circuit to stabilise with constant amplitude pulses applied to it. Correspondingly, the fall time is set by the rate at which the energy stored in the tuned circuit can be dissipated by the active elements. Thus, it is possible to achieve a complete switching cycle in, say, ten cycles of the driving waveform.

The circuit which has been described may be considered as having two stable states, since the single output may have either of two phases. It is possible to construct multi-stable arrangements in which multiple outputs are provided. In such an arrangement, three or more diodes are connected in series, and tuned circuits similar to that formed by the inductors 5
connected to form sev
rangement employing
will be considered as
is exactly the same as
diode A corresponds to
in series correspond to
pair circuit is simi
the diode 3 and
The two con
diode pair circu
either phase may be ob
output with either phase m
circuit.

It will be appreciated
convenient active
described, since
facture and op
cies. However, the
other devices, which m
a generally similar form
with a negative resistance The function of the
capacitor 9 is simply
the desired frequency
may equally well be f
by capacitors and repla
ductor. In this form, a
the inductor.

I claim:

1. An electrical logic
comprising a serially
minal active circu
acteristic having
gions separated by a
elements being connec
flow through said series
said active elements; a s
ments connected across s
tion between said first r
actance element connected
junctions, said first and second reac
forming a tuned circuit; means to apply a u
voltage across said serially-connected pair o
ments; means to apply across said pair of
an alternating driving voltage hav
tially twice the resonant fre
means to derive from said
which is at said resonant fr
tively, one or two phases wh
180°; and means to apply to
signal to select the phase of s 2. An electrical logic circuit
cuit comprising a serially-connected
terminal active circuit elements exhibiting
of current against applied voltage, wh
second positive resistance regions sepa
resistance region, said active elements
the same sense for current flow throug
a first junction between said active el
of inductors connected across said series
junction between the inductors of said p
connected between said first and seco
capacitor and said inductors
circuit; means to apply a
said serially-connected
apply across said pair
driving voltage having a
resonant frequency of s
ductor coupled to said
output signal which is
which has, selectively,
tively displaced by 180°
signal to said first junc
output signal.

ic circuit, including a series circuit
onnected pair of similar two ter-
onnected in the same sense for
series circuit and exhibiting,
lied voltage, first and second
regions and a negative re-
ween said positive resistance
en said active elements; a
ors connected across said
n between said inductors; a
said first and second junc-
aid inductors together forming
o apply a uni-directional voltage
nnected pair of active elements;
said serially-connected pair of ac-
ting driving signal having a fre-
the resonant frequency of the
active elements to switch re-
between said first and second
means to produce an output
the switching of the active ele-
ing at said resonant frequency
of two phases which are rela-
and control means to apply to
l signal to select the phase of rcuit, including a series circuit
cted pair of similar tunnel
me sense for current flow
ch diode exhibiting a cur-
ng first and second positive
ve resistance region be-
ions; a first junction
pply a uni-directional
o bias each diode in the
ir of inductors connected
, a second junction between said
or connected between said first and
, said inductors and said capacitor to-
a tuned circuit; means to apply across
des an alternating driving voltage, having
stantially twice the resonant frequency of
uit, to cause the diodes to switch repeatedly
es between said first and second positive
; means to produce an output signal in
he switching of the diodes, said output
resonant frequency and having, selec-
phases which are relatively displaced
ol means to apply to said first junction
o select the phase of said output signal.
cal logic circuit, including a serially-con-
of similar tunnel diodes each having first and
lectrodes, the first electrode of one diode being
cted to the second electrode of the other diode at
st junction; a series pair of inductors coupled to said
of diodes; a second junction between the inductors of
pair; a capacitor connected between said first and
d junctions, said pair of inductors and said capacitor
r forming a tuned circuit; means to apply, by way
pair of inductors, a voltage across the pair of
o bias each diode to substantially the same operat-
int, each diode exhibiting a current/voltage char-
ic having first and second positive resistance re-
d a negative resistance region between said
istance regions; means to apply across said
an alternating voltage of frequency sub-
the resonant frequency of said tuned
diodes to switch repeatedly in opposite
d first and second positive resistance
ng oscillations in the tuned circuit; a
led to said pair of inductors to pro-
response to said oscillations, said
ly one of two phases depending
ch the diodes switch to said first positive resistance region; modulating means to modulate said alternating voltage to quench and restart said oscillations; and control means to select the phase of said output signals by applying to said first junction a signal to control said sequence.

References Cited in the file of this patent

UNITED STATES PATENTS

| | | |
|---|---|---|
| 2,614,140 | Kreer | Oct. 14, 1952 |
| 3,056,039 | Onyshkevych et al. | Sept. 25, 1962 |
| 3,084,264 | Kosonocky et al. | Apr. 2, 1963 |

OTHER REFERENCES

Pub. I, International Solid State Ckts. Conf., Digest of Tech. Papers, "Parametron and Esaki Diode Progress" in Japan, by Goto, pages 20 and 21, February 15, 1961.

Pub. II (Digest as above), "Parametric Oscillation and Amplification Using Esaki Diodes," pages 28 and 29, February 15, 1961.